United States Patent
Lim et al.

(10) Patent No.: US 10,630,290 B2
(45) Date of Patent: Apr. 21, 2020

(54) LOW LEAKAGE POWER SWITCH

(71) Applicant: Apple Inc., Cupertino, CA (US)

(72) Inventors: Jaemyung Lim, Sunnyvale, CA (US);
Jaroslav Raszka, San Jose, CA (US);
Mohamed H. Abu-Rahma, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/145,662

(22) Filed: Sep. 28, 2018

(65) Prior Publication Data
US 2019/0097631 A1 Mar. 28, 2019

Related U.S. Application Data

(63) Continuation-in-part of application No. 15/717,276, filed on Sep. 27, 2017.

(51) Int. Cl.
| H03K 17/30 | (2006.01) |
| H03K 19/00 | (2006.01) |
| H03K 17/687 | (2006.01) |
| G06F 1/3206 | (2019.01) |
| H03K 19/003 | (2006.01) |
| G06F 1/26 | (2006.01) |
| H03K 17/14 | (2006.01) |
| G06F 1/3296 | (2019.01) |
| G06F 1/3287 | (2019.01) |
| H03K 17/06 | (2006.01) |

(52) U.S. Cl.
CPC .......... *H03K 19/0008* (2013.01); *G06F 1/26* (2013.01); *G06F 1/263* (2013.01); *G06F 1/3206* (2013.01); *G06F 1/3287* (2013.01); *G06F 1/3296* (2013.01); *H03K 17/063* (2013.01); *H03K 17/145* (2013.01); *H03K 17/6872* (2013.01); *H03K 19/00384* (2013.01); *H03K 2017/066* (2013.01); *H03K 2217/0036* (2013.01)

(58) Field of Classification Search
None
See application file for complete search history.

(56) References Cited

U.S. PATENT DOCUMENTS

| 7,053,692 | B2 | 5/2006 | Parris et al. | |
| 8,395,440 | B2 | 3/2013 | Sandhu et al. | |
| 9,110,643 | B2 * | 8/2015 | Idgunji | H03K 19/00369 |
| 9,660,513 | B2 * | 5/2017 | Kataoka | H02M 1/36 |
| 2011/0314317 | A1 * | 12/2011 | Gajjewar | H03K 5/08 713/340 |
| 2012/0113737 | A1 * | 5/2012 | Lee | G11C 5/147 365/226 |
| 2015/0116030 | A1 * | 4/2015 | Jarrar | H03K 17/162 327/536 |

(Continued)

*Primary Examiner* — Lincoln D Donovan
*Assistant Examiner* — Khareem E Almo
(74) *Attorney, Agent, or Firm* — Kowert, Hood, Munyon, Rankin & Goetzel, P.C.

(57) ABSTRACT

Computer systems may include multiple power switch circuits for coupling circuit blocks to power supply signals. Different power supply signals may be selected for use in the generation a control signal for a power switch device in the power switch circuit. For example, during a particular operating mode of a power switch circuit coupled to a circuit block, a power supply signal with a voltage level greater than an power supply signal for the circuit block may be used to generate the control signal.

20 Claims, 14 Drawing Sheets

(56) References Cited

U.S. PATENT DOCUMENTS

| | | | |
|---|---|---|---|
| 2016/0164513 A1* | 6/2016 | Ham | H03K 17/223 |
| | | | 327/536 |
| 2017/0162239 A1* | 6/2017 | Yamashiro | G05F 1/625 |
| 2017/0250679 A1* | 8/2017 | Abe | B41J 2/04593 |
| 2019/0043969 A1* | 2/2019 | Wood | H01L 29/0623 |

* cited by examiner

|   | sleep_b input control signal 1108 | |
|---|---|---|
|   | 0 | 1 |
| disable signal 1107  0 | Low Leakage Power Supply | Ground |
| 1 | Active Power Supply | Ground | switch control signal 1113 voltage levels

*FIG. 12*

LOW LEAKAGE POWER SWITCH

CROSS REFERENCE TO RELATED APPLICATION

This application is a continuation-in-part of co-pending U.S. patent application Ser. No. 15/717,276, filed on Sep. 27, 2017.

BACKGROUND

Technical Field

The embodiments disclosed herein relate to power management and control in an integrated circuit, specifically the use of power switches for power gating.

Description of the Relevant Art

Integrated circuits may include multiple circuit blocks designed to perform various functions. For example, an integrated circuit may include a memory circuit block configured to store multiple program instructions, and a processor or processor core configured to retrieve the program instructions from the memory and execute the retrieved instructions.

In some integrated circuits, different circuit blocks or different portions of a particular circuit block may operate using different power supply voltage levels. Circuit blocks or portions of circuits blocks operating using a common power supply voltage level may be referred as being included in a common power domain. In some integrated circuits, the different power supply voltage levels used within the such integrated circuits may be generated by a Power Management Unit (commonly referred to as a "PMU") or other suitable circuits. Such PMUs may include voltage regulator circuits and supporting control circuits configured to generate the desired power supply voltage levels.

During operation of an integrated circuit, some circuit blocks or portions of a particular circuit may be unused for periods of time. To reduce power dissipation of the integrated circuit, the unused circuit blocks or portions of the particular circuit block may be decoupled from the power supply. When it is determined that a currently unused circuit block is to return to an active state, the currently unused circuit block is coupled to the power supply prior to resuming operation.

SUMMARY OF THE EMBODIMENTS

Various embodiments of a power switch circuit are disclosed. Broadly speaking, an apparatus and a method are contemplated, in which a switch device may be configured to selectively couple a power terminal of a circuit block to a first power supply signal based on a switch control signal. A control circuit may be configured to receive a mode control signal and an input control signal and select one of the first power supply signal and a second power supply signal based on the mode control signal, wherein a voltage level of the second power supply signal is greater than a voltage level of the first power supply signal. The control circuit may also be configured to generate the switch control signal using the input control signal and a selected power supply signal.

BRIEF DESCRIPTION OF THE DRAWINGS

FIG. 12 depicts a table illustrating the voltage levels of switch control signal.

FIG. 14 illustrates a flow diagram depicting an embodiment of a method for operating a power switch circuit is illustrated While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Figure 1:
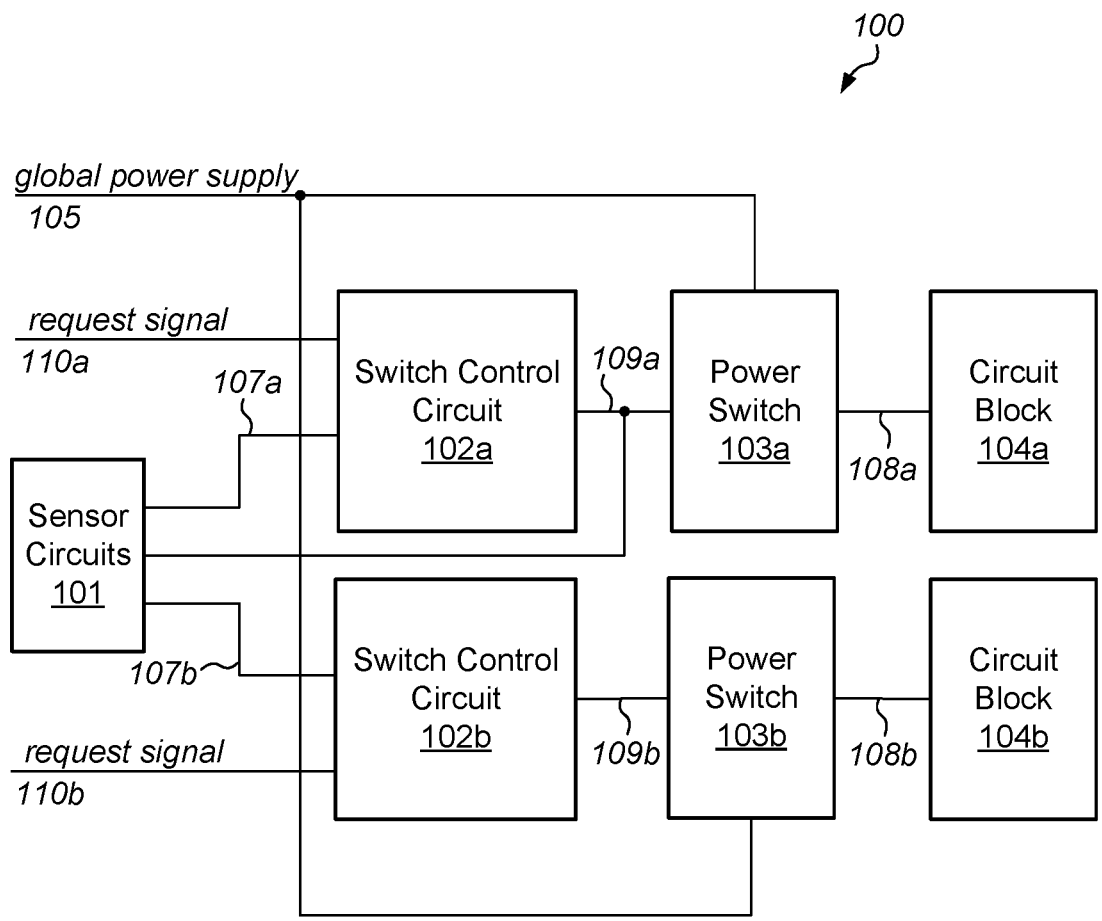
FIG. 1 is a block diagram illustrating an embodiment of a power domain in an integrated circuit that includes power switches.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f)

interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

In some computing systems, to manage power consumption, circuit blocks may be selected to be de-powered for periods of time. When a particular circuit block has been selected to be de-powered, it may be decoupled from a power supply by opening one or more power switches. If the computing system determines the particular circuit block is needed to perform a desired function or execute desired operations, the one or more power switches may be closed to couple the particular circuit block back to the power supply.

When power switches are open, a leakage current may flow through the power switch. Such leakage current is undesirable as it contributes to overall power consumption and, in mobile computing applications, can reduce battery life. The embodiments illustrated in the drawings and described below may provide techniques for operating power switches while reducing the leakage current through the power switches, thereby reducing overall power consumption.

Turning to FIG. 1, an embodiment of a power domain in an integrated circuit that includes power switches is illustrated. In the illustrated embodiment, power domain 100 includes sensor circuits 101, switch control circuits 102a-b, power switches 103a-b, and circuit blocks 104a-b.

As described below in more detail, circuit blocks 104a-b may include any suitable combination of circuit configured to perform a particular function. For example, in some embodiments, a particular one of circuit blocks 104a-b may include a processor or processor core. Alternatively, in other embodiments, the particular one of circuit blocks 104a-b may include multiple data storage cells, row and column decoders, and other circuitry associated with a memory circuit.

Power switches 104a-b are coupled to local power supplies 108a-b, respectively, which are, in turn, coupled to power supply terminals (not shown) of circuit blocks 103a-b, respectively. Although, in the illustrated embodiment, a particular power switch of power switches 104a-b is depicted as being coupled to a corresponding one of circuit blocks 103a-b, in other embodiments, a power switch may be coupled to a particular portion of a particular circuit block (not shown).

As described below in more detail, power switches 103a-b may limit an amount of current that may flow from global power supply 105 to local power supplies 108a-b, respectively based on a voltage level of power switch control signals 109a-b, respectively. In the present embodiment, power switch control signals 109a-b are generated by switch control circuits 102a-b, respectively. As described below in more detail, switch control circuits 102a-b may generate control signals 109a-b based on sensor signals 107a-b, as well as request signals 110a-b. In various embodiments, a processor, power management circuit, or any other suitable circuit (all not shown) may generate request signals 110a-b.

Sensor circuits 101 may, in various embodiments, include multiple circuits each of which may be configured to sense a particular operational or electrical parameter associated with the integrated circuit. For example, in some embodiments, sensor circuits 101 may measure a rate of one or more of control signals 109a-b thereby regulating an amount of current supplied to circuit blocks that are being re-coupled to global power supply 105 after being de-coupled from the power supply. Based on the results from the multiple circuits, sensor circuits 101 may generate sensors signals 107a-b.

It is noted that the embodiment illustrated in FIG. 1 is merely an example. In other embodiments, different circuit blocks and different numbers of circuit blocks may be employed.

Figure 2:
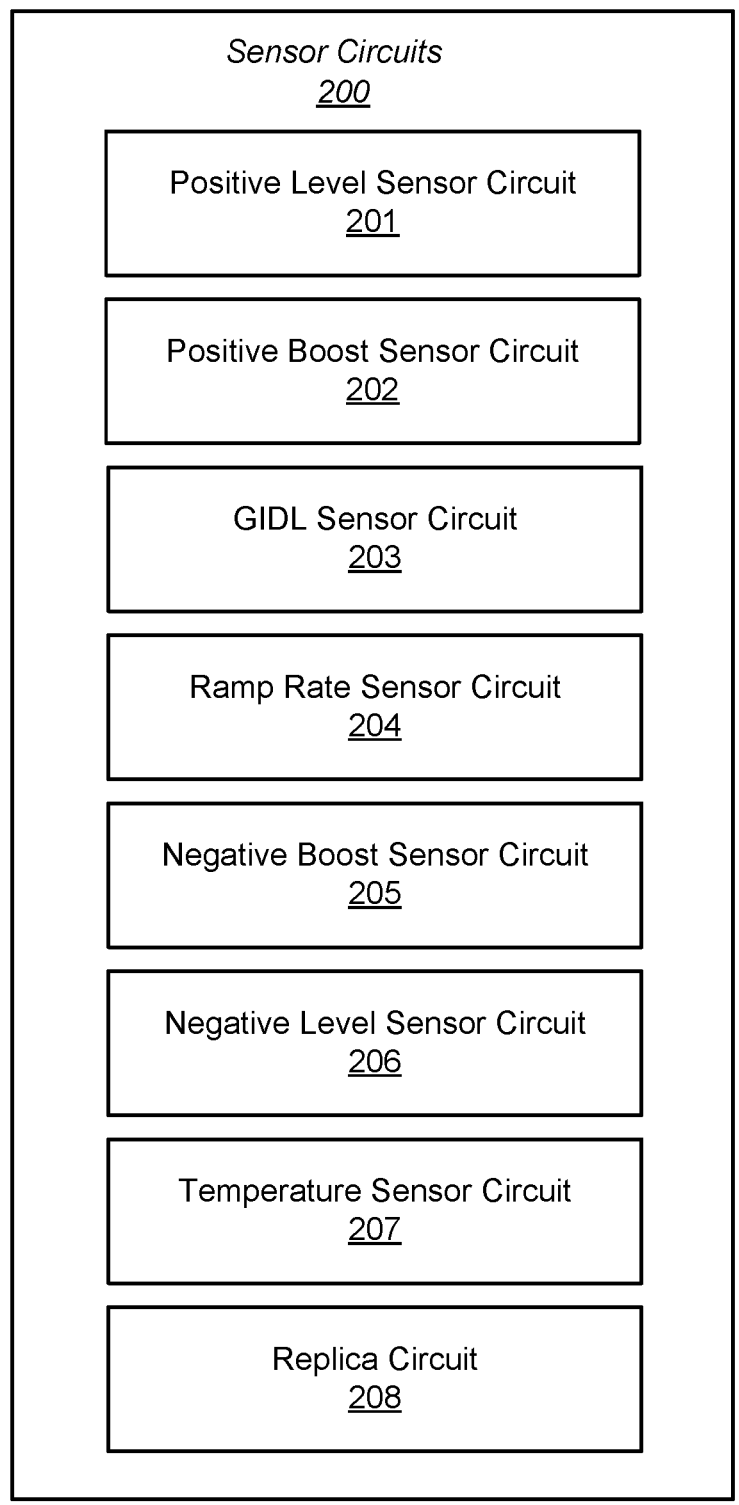
FIG. 2 is a block diagram of a sensor circuit.

As mentioned above, data indicative of operational or electrical parameters may be gathered using sensor circuits in order to determine a target voltage level for the power switch control signals. An embodiment of such sensor circuits is illustrated in FIG. 2. In various embodiments, sensor circuits 200 may correspond to sensor circuits 101 as depicted in the embodiment of FIG. 1. In the illustrated embodiment, sensor circuits 200 includes positive level sensor circuit 201, positive boost sensor circuit 202, gate-induced drain leakage (GIDL) sensor circuit 203, ramp rate sensor circuit 204, negative boost sensor circuit 205, negative level sensor circuit 206, temperature sensor circuit 207, and replica circuit 208. In various embodiments, information gathered from the individual sensors circuits may be assigned different relative priorities, and the relative priorities may be used by a switch control circuit to adjust the voltage level of the power switch control signal.

When a power switch is in an off state, the voltage level of the power switch control signal coupled to the power switch should not exceed a particular voltage value in order to maintain reliability of the switch device. To accomplish this, positive level sensor circuit 201 is configured to measure the voltage level of a power switch control signal and compare the measured voltage level against the particular voltage value. Information generated by positive level sensor circuit 201 may be used to limit the voltage level of the power switch control signal. In various embodiments, information generated by positive level sensor circuit 201 may have a higher priority in determining the voltage level of the power switch control signal than other sensor circuits, such as, positive boost sensor circuit 202 and GIDL sensor circuit 203, for example.

Positive boost sensor circuit 202 is configured to measure leakage current through a power switch when the power switch is in an off state. In some cases, positive boost sensor circuit 202 may use a replica circuit, such as, e.g., replica circuit 208, to make the measurement of the leakage current. The value of the leakage current may be compared to a threshold value, and the voltage level of the power switch control signal may be adjusted based on results of the comparison to achieve a desired level of leakage current in the off-state power switch. In some embodiments, information from the positive boost sensor circuit 202 may have a lower priority than information from GIDL sensor circuit 203 and positive level sensor circuit 201.

As described below in more detail, metal-oxide semiconductor field-effect transistors (MOSFETs) may be included in a power switch. In MOSFETs GIDL and sub-threshold conduction are two sources of leakage current. GIDL sensor circuit 203 may sense current flowing through a power switch resulting from GIDL and sub-threshold conduction. Information from GIDL sensor circuit 203 may be used to adjust the voltage level of the power switch control signal to minimize GIDL and sub-threshold conduction.

When the state of power switch is changing from an off-state to an on-state, current may flow through the power switch to provide power to circuits (commonly referred to as "inrush current") coupled to the power switch. In some cases, the amount of current that initially flows through the power switch during such a state change should be limited to prevent voltage drop of a global power supply, or other undesirable effects. Ramp rate sensor circuit 204 is configured to measure inrush current through a power switch. Information relating to the inrush current may be used to adjust the rate or change (or slope) of the power control switch signal to limit inrush current to within specified power delivery limits.

When a power switch is in an on-state, the impedance of the power switch may result in a voltage drop on the local power supply. To reduce such a drop in the voltage level of the local power supply, negative boost sensor circuit 205 may measure characteristics of the power switch indicative of the on-resistance of the power switch, such as, e.g., a voltage drop across, and current through the power switch, and based on the measured characteristics, the voltage level of the power switch control signal may be adjusted. For example, in the case of a power switch implemented with a p-channel MOSFET, the power switch control signal may be transitioned to a voltage level below ground determined by information from negative boost sensor circuit 205. As with other sensor circuits included in sensor circuits 200, a priority of negative boost sensor circuit 205 may be lower than a priority of negative level sensor circuit 206.

As with positive level sensor circuit 201, negative level sensor circuit 206 compares the voltage level of the power switch control signal to a negative threshold value. Based on results of the comparison, the voltage level of the power switch control signal may be adjusted. By adjusting the voltage level of the power switch control signal in this fashion, reliability goals for devices included in the power switch may be achieved, in various embodiments.

Temperature sensor circuit 207 is configured to measure the temperature of an integrated circuit at or near a location of a power switch. Temperature information generated by temperature sensor circuit 207 may be used to adjust the voltage level of a power switch control signal. Temperature sensor circuit 207 may be designed according to various methodologies. For example, in some embodiments, temperature sensor circuit 207 may include one or more vertical bipolar devices. Although a single temperature sensor circuit is depicted in the embodiment of FIG. 2, in other embodiments, multiple temperature sensor circuits, located at different respective locations, may be employed.

Replica circuit 208 may include one or more devices arranged in a fashion similar to a power switch. In some embodiments, voltage drops across the one or more devices or current through the one or more devices may be measured, and the resultant information used to adjust the voltage level of a power switch control signal. In various embodiments, mask design for replica circuit 208 used to generate photomasks using in a semiconductor manufacturing process, may be similar mask design of a power switch in order to mimic lithographic and manufacturing effects in the power switch.

The sensor circuits described above may be implemented according to various design styles. For example, in some embodiments, a particular sensor circuit included in sensor circuits 200 may include any suitable combination of analog, mixed-signal, logic circuits, and sequential logic circuits.

It is noted that the embodiment illustrated in FIG. 2 is merely an example. In other embodiments, different sensor circuits and different arrangements of sensor circuits may be employed.

Figure 3:
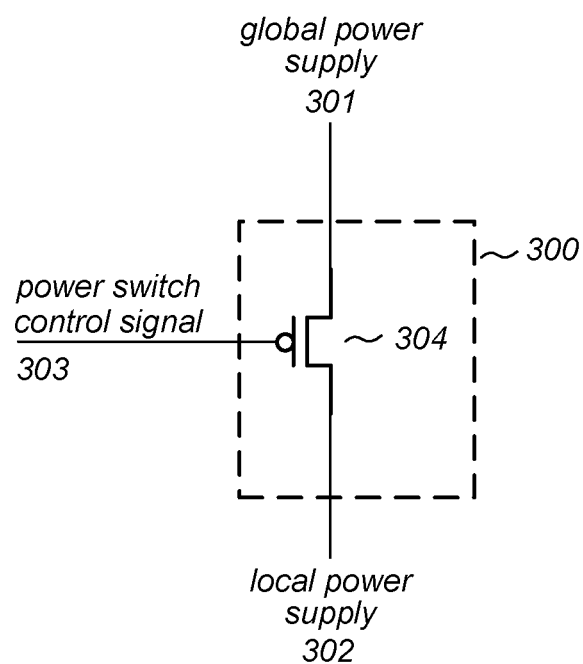
FIG. 3 illustrates a block diagram of a power switch.

Turning to FIG. 3, an embodiment of a power switch is illustrated. In the present embodiment, power switch 300 includes device 304, which is coupled to global power supply 301 and local power supply 302, and controlled by power switch control signal 303.

In various embodiments, a power management unit, or other suitable circuit, included in an integrated circuit, may generate global power supply 301. Local power supply 302 may be coupled to one or more circuit blocks, such as, circuit blocks 104*a-b*, as illustrated in FIG. 1, for example. It is noted that in some embodiments, the power management unit may be located on a different integrated circuit from the one or more circuit blocks.

In some embodiments, power switch control signal 303 may be generated by a switch control circuit, such as switch control circuit 400, for example. In various embodiments, a voltage level of the power switch control signal 303 may determine an amount of current than may flow through device 304. For example, in some cases, at or near ground potential may allow device 304 to conduct current from global power supply 301 to local power supply 302. Alternatively, a voltage level at or near the level of global power supply 301 may prevent device 304 from conducting current from global power supply 301 to local power supply 302.

In various embodiments, device 304 may include a p-channel metal-oxide semiconductor field effect transistor (MOSFET), or any other suitable transconductance device. Although power switch 300 is depicted as including only a single p-channel MOSFET in the embodiment of FIG. 3, in other embodiments, multiple p-channel MOSFETs or transconductance devices connected in parallel may be employed.

Figure 4:
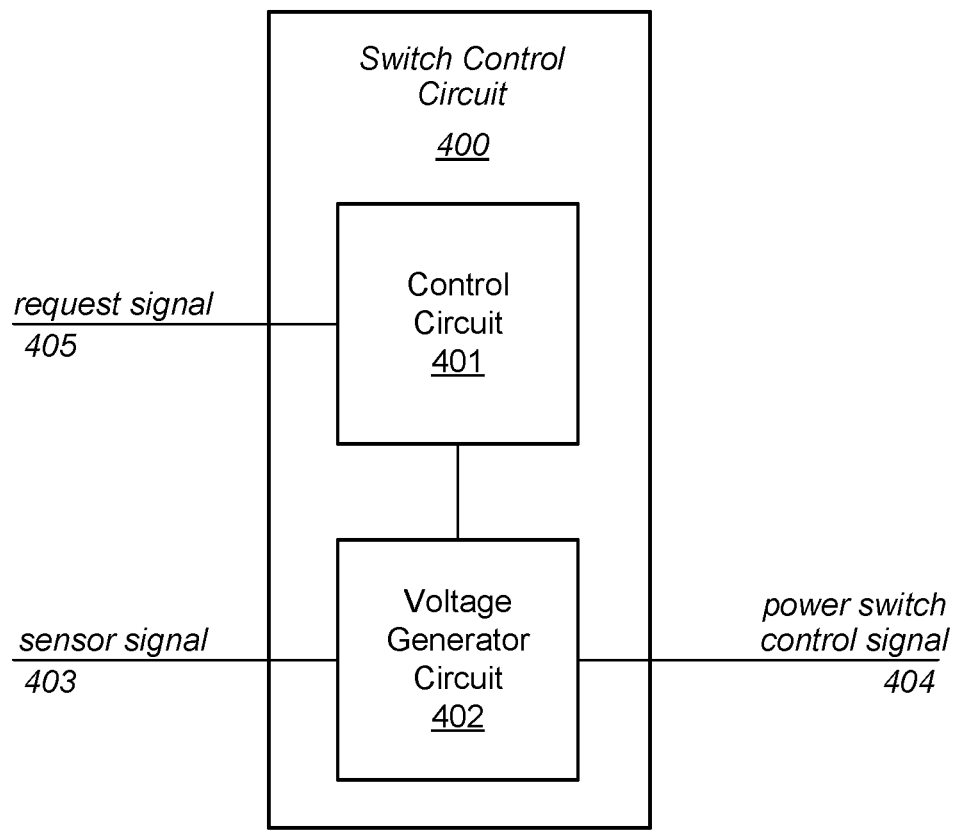
FIG. 4 is a representation of a control signal generator circuit.

Turning to FIG. 4, an embodiment of a switch control circuit is illustrated. In various embodiments, switch control circuit 400 may correspond to either of switch control circuits 102*a-b* as depicted in the embodiment of FIG. 1. In the illustrated embodiment, switch control circuit 400 includes control circuit 401 coupled to voltage generator circuit 402.

Control circuit 401 may include any suitable combination of logic circuit configured to control voltage generator circuit 402. In various embodiments, control circuit 401 may activate voltage generator circuit 402 based on request signal 405.

Voltage generator circuit 402 may be configured to generate power switch control signal 404, which may, in various embodiments, correspond to power switch control signals 109*a-b* as depicted in the embodiment of FIG. 1. In some cases, voltage generator circuit 402 may include charge pumps, boost circuits, or other circuits suitable of generator a voltage level on power switch control signal 404 greater than a global power supply voltage, or less than a ground potential. Voltage generator circuit 402 may, in various embodiments, be configured to generate the voltage level on power switch control signal 404 using sensor signals 403. In some embodiments, sensor signals 403 may correspond to sensor signals 107a-b as depicted in the embodiment of FIG. 1.

It is noted that the embodiment illustrated in FIG. 4 is merely an example. In other embodiments, different circuit blocks and different arrangements of circuit blocks are possible and contemplated.

Figure 5A:
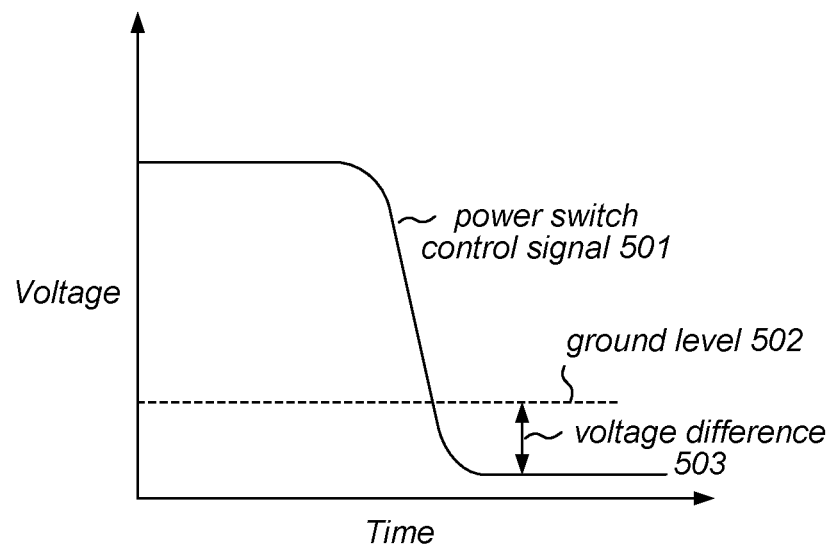
FIG. 5A illustrates a diagram depicting an example waveform associated with the operation of a control signal generator circuit.

Turning to FIG. 5A, an example waveform associated with a control signal generator circuit, such as, e.g., switch control circuit 400, closing a power switch, which includes one or more p-channel MOSFETs is illustrated. In the illustrated embodiment, power switch control signal 501 may correspond to any of power switch control signals 109a-b as depicted in the embodiment of FIG. 1.

Initially, power switch control signal 501 is at a voltage level at or above a voltage level of a power supply, which corresponds to the power switch being open or in an open-state. As described above, the voltage level of power switch control signal may be based on measurements made by or information from one or more sensor circuits, such as, positive level sensor circuit 201, for example.

In response to receiving a signal indicating that the power switch should be transitioned to being closed or to a closed-state, the control signal generator determines a target low voltage for power switch control signal, and begins to transition power switch control signal 501 to the target low voltage. In various embodiments, the target low voltage for power switch control signal 501 may be less than ground level 502. The difference between ground level 502 and the target low voltage of power switch control signal 501, i.e., voltage difference 503, may be based on measurements made by and/or data generated by one or more sensor circuits, such as, e.g., negative boost sensor circuit 205, for example.

In some cases, the rate of change of power switch control signal 501 from its initial high value to the target low value may be monitored by a sensor circuit, such as, ramp rate sensor circuit 204, for example. Based on results on the monitoring by the sensor circuit, the rate of change of power switch control signal 501 may be adjusted, thereby regulating inrush current through the power switch to a circuit block coupled to the power switch. By regulating inrush current in this fashion, drops in the voltage level of a power supply may be reduced.

It is noted that the waveform depicted in FIG. 5A, is merely an example. In other embodiments, the voltage levels and ramp times associated with power switch control signal 501 may be different.

Figure 5B:
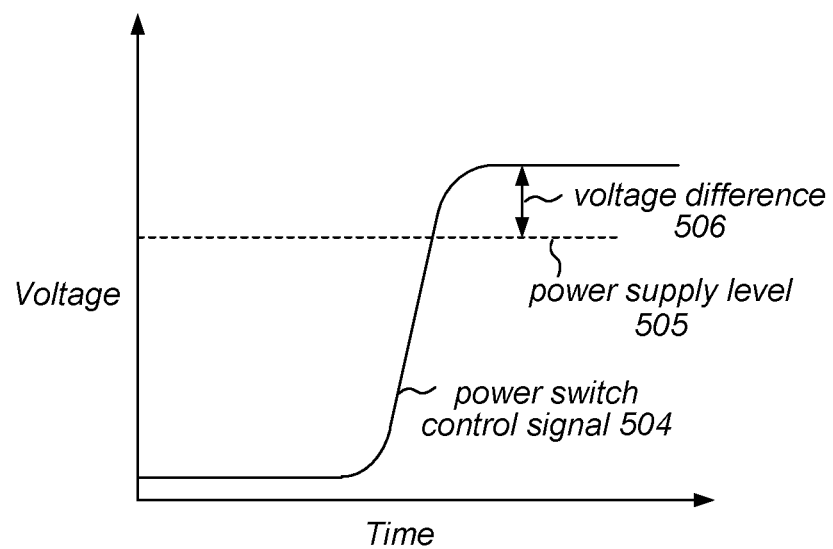
FIG. 5B illustrates a diagram depicting an additional example waveform associated with the operation of a control signal generator circuit.

Turning to FIG. 5B, an example waveform associated with a control signal generator, such as, e.g., switch control circuit 400, opening a power switch, which includes one or more p-channel MOSFETs, is illustrated. In the present embodiment, power switch control signal 504 may correspond to any of power switch control signals 109a-b as illustrated in the embodiment of FIG. 1.

Initially, power switch control signal 504 is at a voltage at or below ground level, which corresponds to the power switch being in a closed-state. As described above, the voltage level of power switch control signal 504 may be based on measurements by one or more sensor circuits, such as, negative level sensor circuit 206, for example. In some embodiments, the voltage level of power closed-state voltage level of power switch control signal may be based, at least in part, on leakage current flowing through the power switch.

In response to receiving a signal indicating that the power switch should be transitioned to an open-state, the control signal generator determines a target high voltage for power switch control signal 504, and begins to transition power switch control signal 504 to the target high voltage. In various embodiments, the new target voltage for power switch control signal 504 may be greater than a voltage level of power supply level 505. The difference between power supply level 505 and the target high voltage of power switch control signal 504, i.e., voltage difference 506, may be based on measurements made by and/or data generated by one or more sensor circuits, such as, e.g., positive boost sensor circuit 202, for example.

By selecting the target high voltage for power switch control signal 504 to be greater than power supply level 505, leakage current through the power switch resulting from sub-threshold conduction and/or GIDL may be reduced, thereby reducing overall power consumption of a computing system.

It is noted that the waveform depicted in FIG. 5B is merely an example. In other embodiments, the use of power switch circuits that employ different technology may result in different voltage levels than those depicted in the FIG. 5B.

As described above, during operation of an integrated circuit, circuit blocks or portions of circuit blocks that are not currently being used in the execution of a computing task may be decoupled from a corresponding internal power supply in order to reduce power consumption of the integrated circuit. To decouple such circuit blocks or portions of circuit blocks, one or more power switches coupling the circuit blocks or portions of circuit blocks to the internal power supply may be opened.

Figure 6:
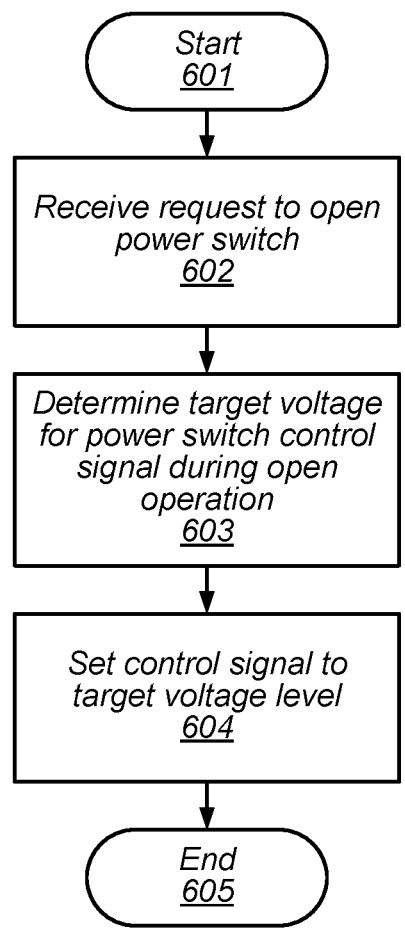
FIG. 6 is a flow diagram depicting an embodiment of a method for closing a power switch.

A flow diagram depicting an embodiment of a method for opening a power switch is depicted in FIG. 6. In the illustrated embodiment, the method begins in block 601. A request to open a power switch associated with a particular circuit block or portion of a circuit block may then be received (block 602). In various embodiments, the request may be generated by a processor or other control circuit and received by a control signal generator circuit, such as, control signal generator circuit 400 as depicted in the embodiment of FIG. 4.

In response to receiving the request, a desired voltage level for a power switch control signal generated by the control signal generator circuit may then be determined (block 603). In various embodiments, the value of the power switch control signal may be based on a desired amount of leakage current that may flow through the power switch. The temperature of the power switch, the voltage level of a global power supply coupled to the power switch, or other semiconductor process related parameters may be employed in determining the desired voltage level of the power switch control signal. In some cases, a circuit that mimic the behavior of a given power switch (commonly referred to as a "replica circuit") may be employed to determine electrical characteristics similar to those of the power switch. Such electrical characteristics may be used in determining the desired voltage level of the power switch control signal.

Once the desired voltage level for the power switch control signal has been determined, the power switch control signal may then be transitioned to the desired level (block 604). In some embodiments, the voltage level of the control signal may be transitioned from an initial voltage level to the desired voltage level over a period of time to limit sudden changes in current through multiple power switches. In some cases, the voltage level of the power switch control signal may be monitored during the transition period by a sensor circuit, such as, e.g., sensor 101 as depicted in FIG. 1. The monitored voltage level of the power switch control signal may be compared to the desired voltage level using a comparator or other suitable circuit. When the monitored voltage level of the power switch control signal is substantially equal to the desired voltage level, the control signal generator circuit may halt further changes in the voltage level of the power switch control signal.

Once the control signal has achieved the desired voltage level, the method may conclude in block 605. It is noted that the embodiment of the method illustrated in the flow diagram of FIG. 6 is merely an example. In other embodiments, different operations and different orders of operations may be employed.

When it is determined that a circuit block or portion of a circuit block that is current decoupled from its corresponding internal power supply is to be recoupled to the internal power supply, the power switches associated with the circuit block or portion of circuit block may be closed. An embodiment of a method for closing such power switches is depicted in the flow diagram of FIG. 7. The method starts in block 701.

A request to close a particular power switch may be received (block 702). The request may be received from a processor or other control circuit by a control signal generator circuit, such as, e.g., switch control circuit 400, associated with the particular power switch. In various embodiments, the request may be the result of a determination that a circuit block or portion of the circuit block coupled to the particular power switch are to be used in a task to be performed.

The desired voltage level for power switch control signals coupled to the particular power switch may then be determined (block 703). In various embodiments, the desired voltage level for the power switch control signals may be determined using data gathered from one or more sensor circuits, such as, sensor circuit 200, for example. In some cases, the desired voltage level may be based, at least in part, on a desired on-resistance associated with the particular power switch, and may be a negative voltage, i.e., a voltage level less than the potential of a ground supply.

Once the desired voltage level for the power switch control signals has been determined, the power switch control signals are set to the desired voltage level (block 704). In various embodiments, the control signal generator circuit associated with the particular power switch may monitor the rate at which the power switch control signals are transitioned to the desired voltage level. The transition of the power switch control signals to the desired voltage level may be made over a period of time in order to limit the initial current flowing through the particular switch (commonly referred to as "inrush current"), as the circuit block coupled to the particular switch is returned to a powered state. Once the power switch control signals for the particular power switch have been set to the desired voltage level, the method may conclude in block 705.

Figure 7:
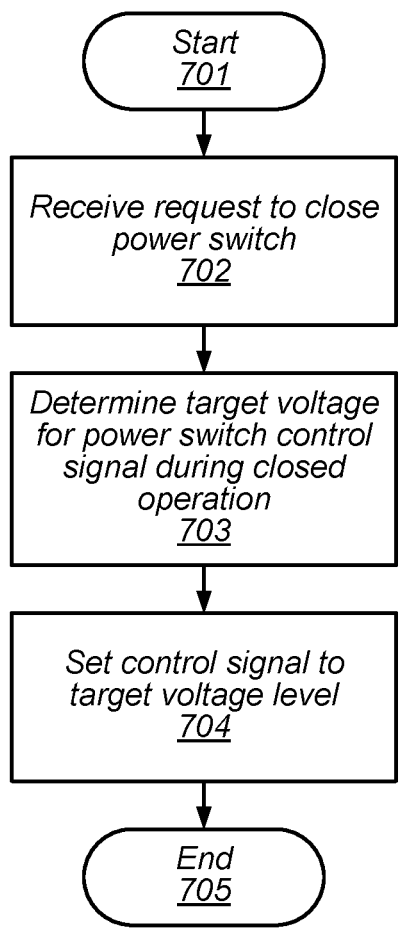
FIG. 7 is a flow diagram depicting an embodiment of a method for closing a power switch.

It is noted that the embodiment of the method illustrated in the flow diagram of FIG. 7 is merely an example. In other embodiments, different operations and different orders of operations may be employed.

In order to limit the voltage drop across a power switch, large devices may be employed to create the power switch. Such large devices may be constructed from multiple smaller devices coupled in parallel, which may result in a large load for a switch control circuit, such as, switch control circuit 102a, for example.

Figure 8:
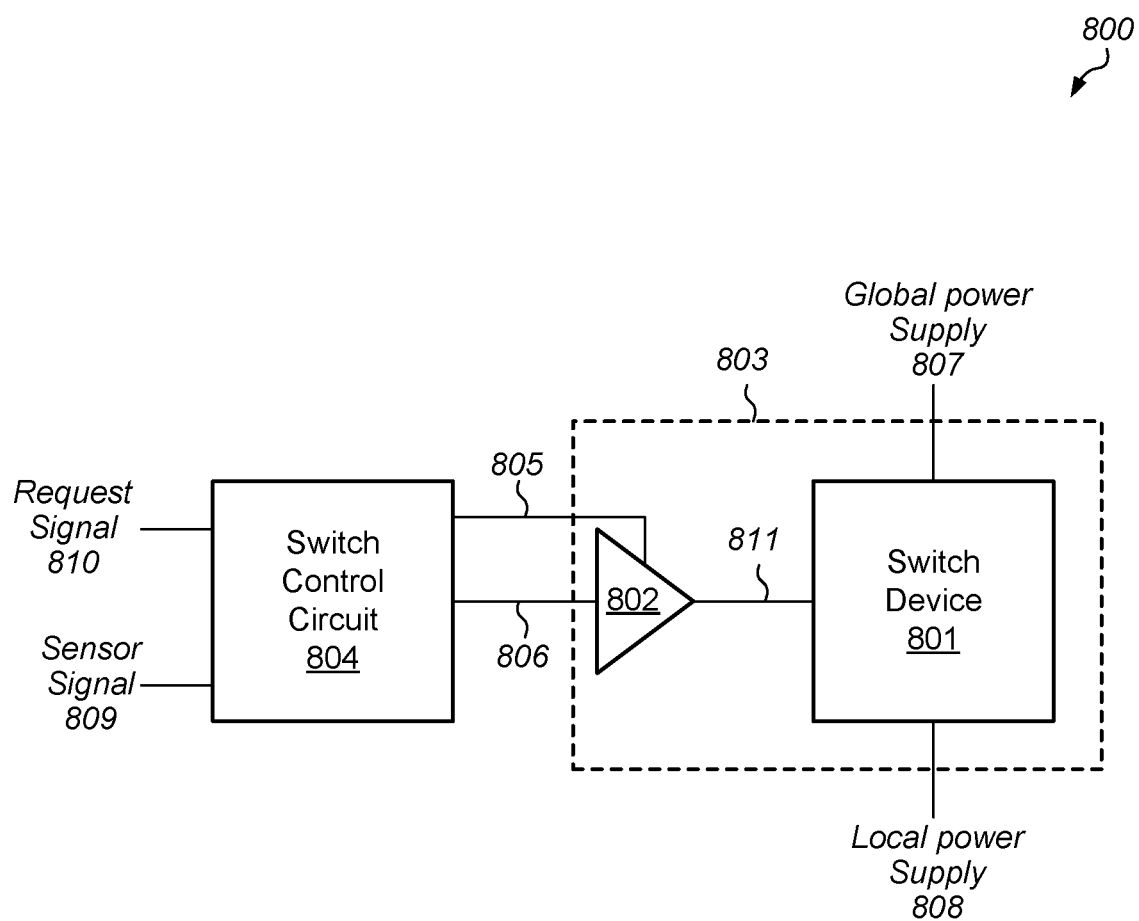
FIG. 8 illustrates a diagram depicting an embodiment of a power switch with a local buffer.

To allow for a switch control circuit to control a power switch that includes a large load, a local buffer circuit may be employed. A block diagram depicting power switch system that includes switch control circuit and associated power switch with a local buffer is illustrated in FIG. 8. In the illustrated embodiment, power switch system 800 includes switch control circuit 804 and power switch 803.

Switch device 801 may, in various embodiments, correspond to power switch 300 as depicted in the embodiment of FIG. 3, and may be configured to selectively coupled global power supply 807 to local power supply 808 using buffered switch control signal 811. In some embodiments, switch device 801 may include multiple transconductance devices, such as, e.g., MOSFETs, coupled in parallel.

Switch control circuit 804 may, in various embodiments, be similar to switch control circuit 400 as illustrated in the embodiment of FIG. 4. In the present embodiment, switch control circuit 804 generates switch control signal 806 using request signal 810 and sensor signal 809. Additionally, switch control circuit 804 generates local buffer power supply signal 805 using request signal 810 and sensor signal 809. In various embodiments, switch control signal may increase the voltage level of local buffer power supply signal 805 to be greater than the voltage level of global power supply 807. By increasing the voltage level of local buffer power supply signal 805 in such a fashion, the voltage level of buffered switch control signal 811 may be also increased above the voltage level of global power supply 807, thereby reducing leakage in switch device 801.

Local buffer 802 is configured to generate buffered switch control signal 811 using switch control signal 806 and local buffer power supply signal 805. In various embodiments, local buffer 802 may include one or more transconductance devices, such as, e.g., MOSFETs, or other suitable circuits, such as, inverters, for example. By employing local buffer 802, switch control circuit 804 can drive a larger power switch device. Although depicted as being non-inverting, in other embodiments, local buffer 802 may invert the logical sense of switch control signal 806 to generate buffered switch control signal 811. In such cases, the logical sense of switch control signal 806 may also be inverted It is noted that the embodiment of FIG. 8 is merely an example. In other embodiments, different numbers of local buffers, and different arrangements of local buffers may be employed.

Figure 9:
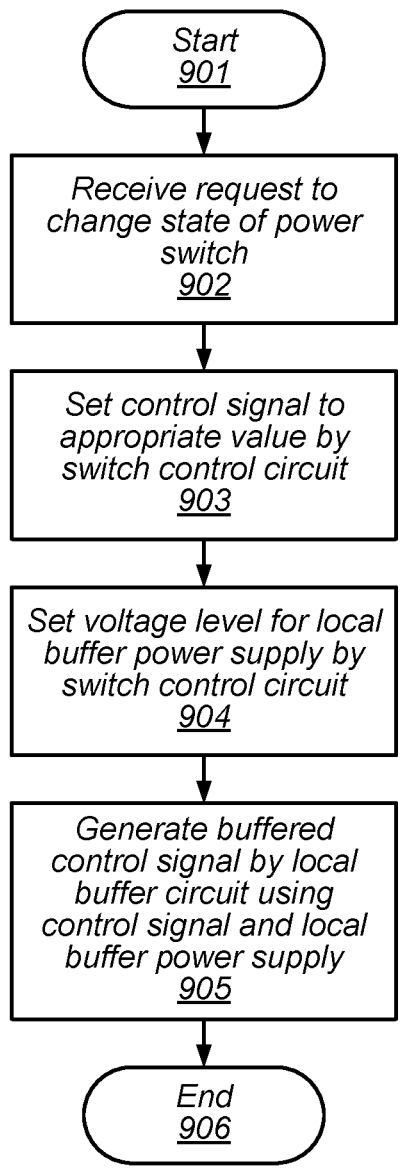
FIG. 9 is a flow diagram depicting an embodiment of a method for operating a power switch that includes a local buffer.

A flow diagram depicting an embodiment of a method for operating a power switch that includes a local buffer is illustrated in FIG. 9. Referring collectively to the embodiment depicted in FIG. 8, and the flow diagram of FIG. 9, the method begins in block 901.

Switch control circuit 804 may then receive a request to change the state of the power switch 803 via request signal 810 (block 902). If power switch 803 is closed, the request may include a request to open power switch 803, i.e., decouple global power supply 807 from local power supply 808. Alternatively, if power switch 803 is open, then the request may include a request to close power switch 803.

Switch control signal 806 may then set to an appropriate value by switch control circuit 804 (block 903). In various embodiments, switch control signal 806 may be generated based on request signal 810 and sensor signal 809 as described above in regard to FIG. 6 and FIG. 7.

The voltage level of local buffer power supply signal 805 may be set by switch control circuit 804 (block 904). In various embodiments, switch control circuit 804 may set the voltage level of local buffer power supply signal 805 to a level greater than the voltage level of global power supply 807.

Local buffer 802 may then generate buffered control signal 811 using switch control signal 806 and local buffer power supply signal 805 (block 905). The state of switch device 801 may then change according to the voltage level of buffered control signal 811. The method may then conclude in block 906.

It is noted that the embodiment depicted in the flow diagram of FIG. 9 is merely an example. In other embodiments, different operations and different arrangements of operations are possible and contemplated.

Figure 10:
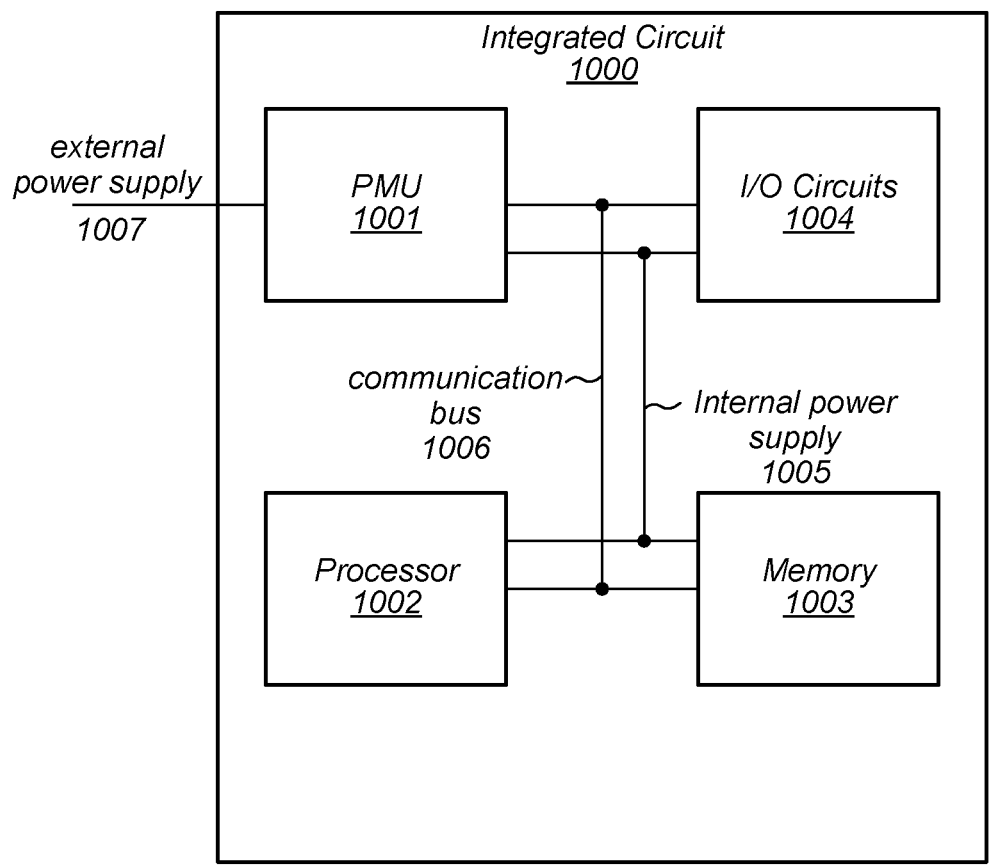
FIG. 10 is a generalized block diagram of an embodiment of an integrated circuit.

Turning to FIG. 10, an embodiment of an integrated circuit is illustrated. In the illustrated embodiment, integrated circuit 1000 includes power management unit (PMU) 1001, processor 1002, memory 1003, and input/output (I/O) circuits 1004. As described below in more detail, individual circuit blocks, such as, e.g., processor 1002, may include one or more power switches that may function as described above.

PMU 1001 may include voltage regulation and associated control circuits (not shown) configured to generate internal power supply 1005 using external power supply 1007. Although a single internal power supply is depicted in the embodiment of FIG. 10, in other embodiments, any suitable number of internal power supplies may be employed. In some cases, each internal power supply may have a different voltage level. In some embodiments, PMU 1001 may include sensor or switch control circuit, such as depicted in the embodiment of FIG. 1.

Memory 1003 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 10, a single memory block is depicted. In other embodiments, any suitable number of memory blocks may be employed.

Processor 1002 may include one or more processor cores configured to execute program instructions according to a particular instruction set architecture (ISA). During execution of program instructions, Processor 1002 may retrieve the program instructions from memory 1003 using communication bus 1006. In various embodiments, communication bus 1006 may be configured to allow requests and responses to be exchanged between processor 1002, memory 1003, and I/O circuits 1004 according to a particular one of various communication protocols.

I/O circuits 1004 may be configured to coordinate data transfer between integrated circuit 1000 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O circuits 1004 may be configured to implement a version of Universal Serial Bus (USB) protocol or IEEE 1394 (Firewire®) protocol.

In various embodiments, each of the included circuit blocks, such as, e.g., processor 1002, may include one or more power switches, such as, e.g., power switch 300, sensor circuits, such as, e.g., sensor circuit 200, and control signal generator circuits, such as, switch control circuit 400, for example. During operation, the power switches may be employed to decouple a particular circuit block, or a portion thereof, from internal power supply 1005, in response to a determination that the particular circuit block, or portion thereof, will be unused for a period of time. When the particular circuit block, or portion thereof, has a task to perform, the power switches may be closed to recoupled the particular circuit, or portion thereof to internal power supply 1005.

It is noted that the embodiment illustrated in FIG. 10 is merely an example. In other embodiments, different numbers of circuit blocks, and different arrangements of circuit blocks are possible and contemplated.

As described above, low leakage power switch circuits may be employed in a computer system to disconnect inactive circuit blocks from their respective power supplies in order to reduce power dissipation. Use of such switches, however, is not without risk. In some cases, if a particular low leakage power switch fails, it may not be possible to disable it without disabling all low leakage power switch functionality.

Moreover, since the power switch devices are coupled to a common control signal, an accumulated voltage drop across the common control signal may result in some control terminals (or "gates") of corresponding power switch devices having an insufficient voltage level necessary to enable the power switches. Additionally, activating power switch circuits using a common control signal can result in too many power switch devices activating within a particular period of time, resulting in high in-rush currents as a circuit block returns to an active state.

The embodiments disclosed in FIG. 11 through FIG. 14 may provide techniques for using power switch circuits that allow for selective disabling of certain power switch circuits, remediation of the voltage drop of the power switch device control signal, and sequential enabling of power switch circuits to eliminate potential high in-rush currents, which maintaining a low circuit area profile.

Figure 11:
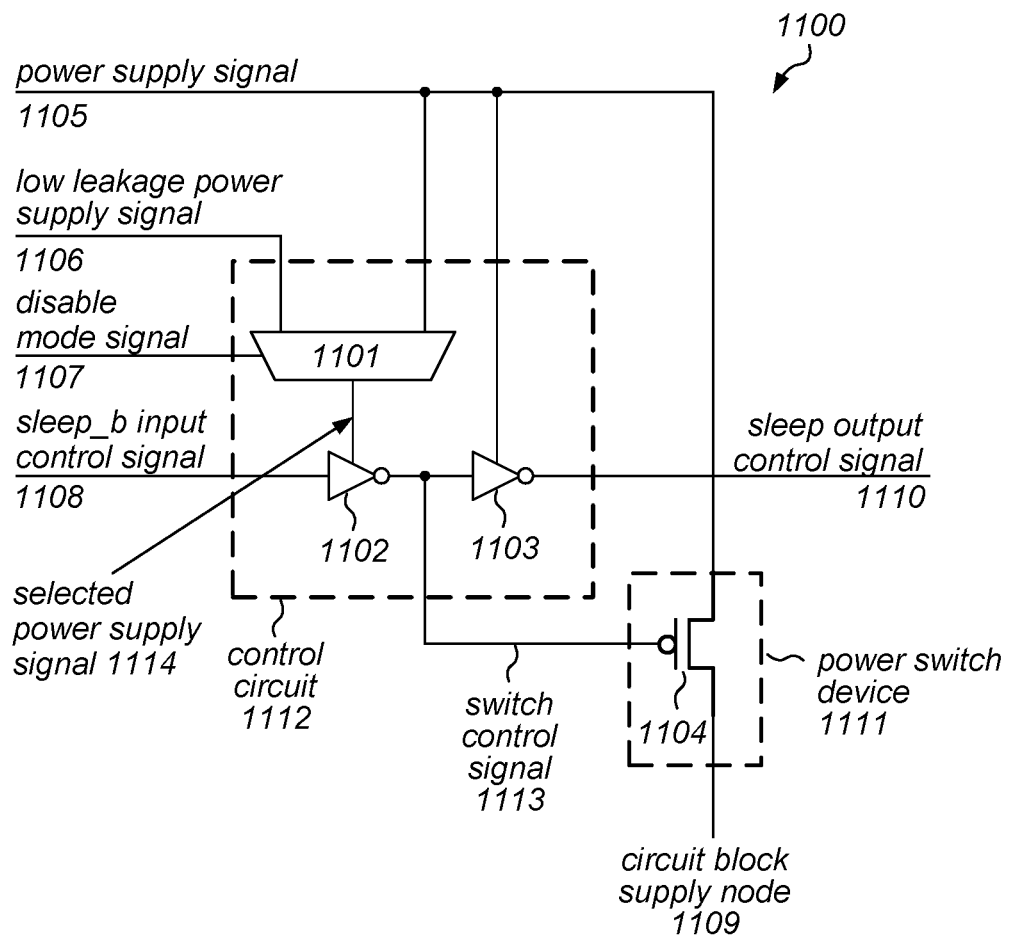
FIG. 11 illustrates a diagram depicting an embodiment of a power switch.

An embodiment of a power switch circuit is illustrated in FIG. 11. In the illustrated embodiment, power switch circuit 1100 includes control circuit 1112 and power switch device 1111. In various embodiments, power switch circuit 1100 may be included in any of the circuit blocks included in integrated circuit 1000.

Power switch device 1111 is configured to selectively couple a power terminal of a circuit block to a first power supply signal based on a switch control signal. For example, based on the state of switch control signal 1113, power switch device 1111 will couple circuit block supply node 1109 to power supply signal 1105. In various embodiments, power supply signal 1105 and low leakage power supply signal 1106 may be generated by a voltage regulator circuit or other power management circuit included in a computer system.

Power switch device 1111 includes device 1104. In some cases, device 1104 may be a particular embodiment of a p-channel metal-oxide semiconductor field-effect transistor (MOSFET). It is noted, however, that in other embodiments, different types of transistors, such as, bipolar transistors, may be employed. It is further noted that although a single device is depicted as being included in power switch device 1111, in other embodiments, any suitable number of devices may be employed.

Control circuit 1112 includes multiplex circuit 1101 and inverters 1102 and 1103, and is configured to receive a mode control signal and an input control signal. For example, control circuit 1112 receives disable mode signal 1107 the value of which determines an operating mode for power switch circuit 1100. In various embodiments, disable mode signal 1107 may be generated by a power management circuit included in a computer system included power switch circuit 1100. Disable mode signal 1107 may, in some embodiments, be used to disable the use of low leakage power supply signal 1106 by power switch circuit 1100 while still allowing power switch circuit 1100 to decouple circuit block supply node 1109 from power supply signal 1105.

Control circuit 1112 is also configured to select one of the first power supply signal and a second power supply signal based on the mode control signal. It is noted that a voltage level of the second power supply signal is greater than a voltage level of the first power supply signal. In various embodiments, control circuit 1112 is configured select the first power supply signal in response to a determination that a value of the mode control signal is indicative of a first operation mode of the switch device and select the second power supply signal in response to a determination that the value of the mode control signal is indicative of a second operation mode of the switch device, wherein a leakage current of the switch device is less while operating in the second operation mode than while operating in the first operation mode.

Control circuit 1112 is further configured to generate the switch control signal using the input control signal and a selected power supply signal. As illustrated, control circuit 1112 generates switch control signal 1113 using selected power supply signal 1114. As described above, multiplex circuit 1101 is configured to select one of power supply signal 1105 and low leakage power supply signal 1106 to generate selected power supply signal 1114. As described below in more detail, inverter 1102, which is powered by the output of multiplex circuit 1101, generates switch control signal 1113 which has an opposite logical sense of sleep_b input control signal 1108.

By selecting low leakage power supply signal 1106 to generate switch control signal 1113, the leakage current through device 1104 may be reduced when device 1104 is in an inactive state (i.e., circuit block node 1109 is decoupled from power supply signal 1105). The reduction in leakage current through device is the result of the voltage level of low leakage power supply signal 1106 being greater than the voltage level of power supply signal 1105, thereby driving device 1104 further into cutoff. Overall power consumption of a computer system may be reduced by employing power switches with a low leakage mode, such as described above.

Control circuit 1112 is further configured to generate an output control signal based on the input control signal, wherein the output control signal is coupled to another control circuit. For example, control circuit 1112 inverts the logical sense of switch control signal 1113 to generate sleep output control signal 1110, which may be routed to at least one other power switch circuit. Since there are several gate delays between sleep_b input control signal 1108 and sleep output control signal 1110, an activation of a next power switch circuit in line, will be delayed, thereby reducing the in-rush current from power supply signal 1105 as the circuit block returns to an active state.

It is noted that the embodiment of a power switch circuit illustrated in FIG. 11 is merely an example. In other embodiments, control circuit 1112 may include different numbers and arrangements of logic gates, and power switch device 1111 may include different types and/or number of transistors.

Turning to FIG. 12, a table illustrating the voltage levels of switch control signal 1113 of power switch circuit 1100 is depicted. In the illustrated table, the voltage levels of switch control signal 1113 are shown for different combinations of disable mode signal 1107 and sleep_b input control signal 1108.

When both sleep_b input control signal 1108 and disable mode signal 1107 are at low logic levels, then switch control signal 113 is coupled to low leakage power supply signal 1106. Since the voltage level of low leakage power supply signal 1106 is greater than the voltage level of power supply signal 1105, the control terminal of device 1104 is driven to a higher voltage than the source terminal of device 1104, forcing device 1104 further into cutoff, thereby reducing leakage current through device 1104.

In the case where disable mode signal 1107 is at a low logic level and sleep_b input control signal 1108 is at a high logic level, switch control signal 1113 is at or near ground potential, which activates device 1104, coupling circuit block supply node 1109 to power supply signal 1105. By coupling circuit block supply node 1109 to power supply signal 1105, the circuit block is able to drawn power from power supply signal 1105, allowing operation of the circuit block. In a similar fashion, when disable mode signal 1107 is a high logic level and sleep_b input control signal 1108 is at a high logic level, switch control signal 1113 is also at or near ground potential.

When disable mode signal 1107 is at high logic level and sleep_b input control signal 1108 is at low logic level, switch control signal 1113 is at a voltage level at or near than or an active power supply, such as power supply signal 1105. Since the control terminal of device 1104 is at the same potential as its source terminal, device 1104 will not conduct, decoupling circuit block supply node 1109 from power supply signal 1105. It is noted, however, the difference in electric potential between the source terminal of device 1104 and the drain terminal of device 1104 may result in a leakage current flowing from the source terminal to the drain terminal. The leakage current may contribute to the overall power consumption of the computer system. As described above, the leakage current may be reduced by changing the voltage level of switch control signal 1113.

Although only two control signals are depicted as controlling the state of switch control signal 1113, in other embodiments, additional control signals may be employed allowing for more than three voltage levels that are available to switch control signal 113.

Figure 13:
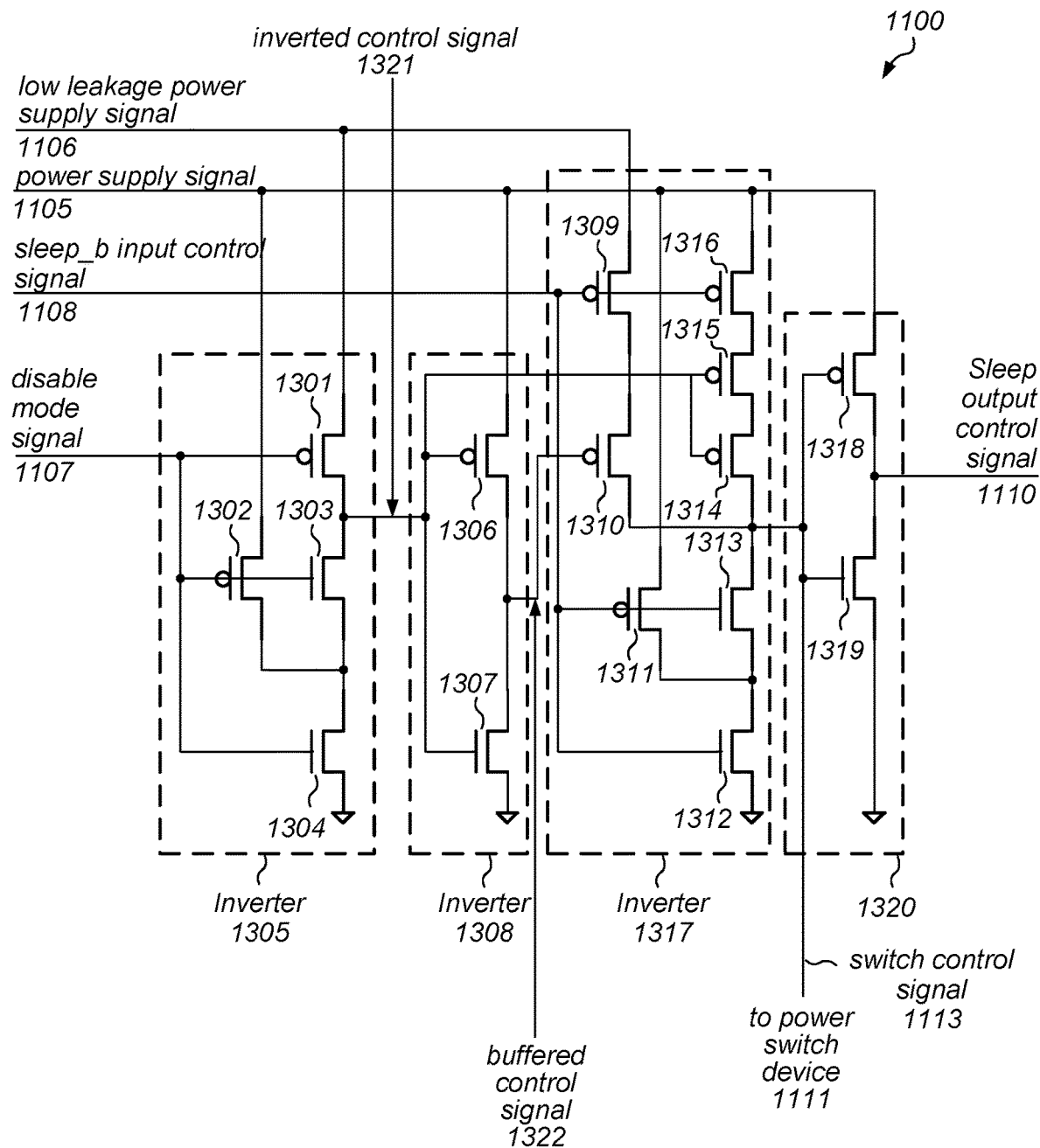
FIG. 13 illustrates a diagram depicting an embodiment of a control circuit used in a power switch.

Control circuit 1112 may be designed and implemented according to one of various design styles. A particular embodiment of control circuit 1112 is illustrated in FIG. 13. As illustrated, control circuit 1112 includes inverters 1305, 1308, 1017, and 1320.

Inverter 1305 includes device 1301 through 1304. In various embodiments, devices 1301 and 1302 are particular embodiments of p-channel MOSFETs and device 1303 and 1304 are particular embodiments of n-channel MOSFETs. Control terminals of devices 1301-1304 are coupled to disable mode signal 1107. Device 1301 is coupled between low leakage power supply signal 1106 and inverted control signal 1321 and device 1303 is coupled between inverted control signal 1321 and device 1303, which is, in turn coupled to device 1304. Device 1302 is coupled between power supply signal 1105 and devices 1303 and 1304.

During operation, inverter 1305 changes the logical sense of disable mode signal 1107 to generate inverted control signal 1321. When disable mode signal 1107 is at a low logic level, devices 1301 is active, pulling inverted control signal 1321 to a voltage level at or near that of low leakage power supply signal 1106. Device 1302 is also active, pulling the circuit node between devices 1303 and 1304 to a voltage level at or near that of power supply signal 1105. By increasing the voltage level of the circuit node between devices 1303 and 1304, the electric field across device 1303 is reduced, thereby reducing leakage through devices 1303 which is inactive due to the low logic level on disable mode signal 1107.

Inverter 1308 includes devices 1306 and 1307. Device 1306 is an embodiment of a p-channel MOSFET and device 1307 is an embodiment of an n-channel MOSFET. Control terminals of devices 1306 and 1307 are both coupled to inverted control signal 1321. Device 1306 is coupled between power supply signal 1105 and buffered control signal 1322 and device 1307 is coupled between buffered control signal 1322 and ground.

During operation, inverter 1308 inverts the logical sense of inverted control signal 1321 to generate buffered control signal 1322. In various embodiments, the voltage level of buffered control signal 1322 may transition between ground and the voltage level of power supply signal 1105.

Inverter 1317 includes devices 1309 through 1316 and is configured to select one of low leakage power supply signal 1106 or power supply signal 1105 to provide the high voltage level for switch control signal 1113. Devices 1309, 1310, 1311, 1314, 1315, and 1316 are embodiments of p-channel MOSFETs and devices 1312 and 1313 are embodiments of n-channel MOSFETs.

A control terminal of device 1310 is coupled to buffered control signal 1322 and control terminals of devices 1309, 1311, 1312, 1313, and 1316 are coupled to sleep_b input control signal 1108. Control terminals for devices 1314 and 1315 are coupled to inverted control signal 1321.

During operation, when disable mode signal 1107 is at low logic level, inverted control signal 1321 is at a high logic level and buffered control signal 1322 is at a low logic level, resulting in devices 1314 and 1315 being disabled, while device 1310 is enable. When sleep_b input control signal 1108 is at a low logic level, device 1309 is enabled, resulting in switch control signal 1113 being coupled to low leakage power supply signal 1106 via devices 1309 and 1310.

Alternatively, when disable mode signal 1107 is at a high logic level, inverted control signal 1321 is at a low logic level and buffered control signal 1322 is at a high logic level, resulting in devices 1314 and 1315 being enable, while device 1310 is disabled. When sleep_b input control signal 1108 is at a low logic level, device 1316 is enable, charging switch control signal 1113 to a voltage level at or near that of power supply signal 1105 via devices 1314, 1315, and 1316.

When sleep_b input control signal 1108 is at a high logic level, devices 1313 and 1312 are both enabled, resulting in switch control signal 1113 being discharged to ground potential via devices 1313 and 1312, regardless of a state of disable mode signal 1107.

Inverter 1320 includes devices 1318 and 1319 and is configured to invert the logical sense of switch control signal 1113 to generate sleep output control signal 1110. Device 1318 is an embodiment of a p-channel MOSFET and is coupled between power supply signal 1105 and sleep output control signal 1110. Device 1319 is an embodiment of an n-channel MOSFET and is coupled between sleep output control signal 1110 and ground. Control terminals of devices 1318 and 1319 are both coupled to switch control signal 1113.

It is noted that the embodiment of control circuit 1100 is merely an example. In other embodiments, different numbers of devices and different types of devices, including devices other than CMOS, may be employed.

Figure 14:
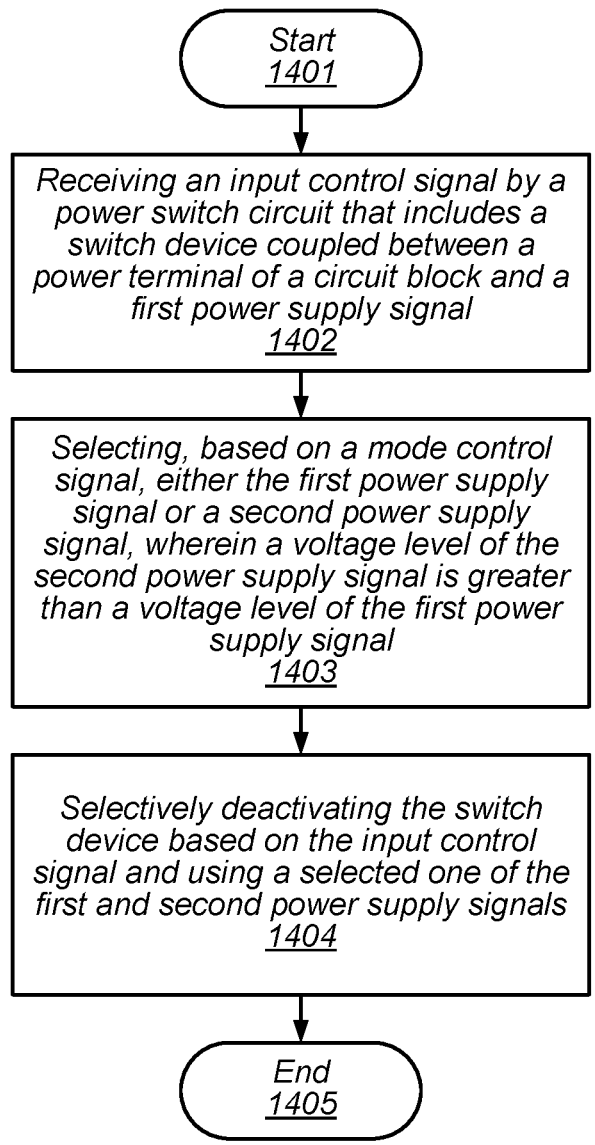

Turning to FIG. 14, a flow diagram depicting an embodiment of a method for operating a power switch circuit is illustrated. The method, which begins in block 1401, may be applied to power switch circuit 1100 as depicted in FIG. 11 or any other suitable power switch circuit.

The method includes receiving an input control signal by a power switch circuit that includes a switch device coupled between a power terminal of a circuit block and a first power supply signal (block 1402). During operation of a computer system including power switch circuits, control signals are generated and routed to the various power switches within the computer system. When a particular circuit block of the computer system is not being used, the particular circuit block may be decoupled from its associated power supply signal by changing a state of the control signal coupled to the power switch circuit coupled to the particular circuit block.

The method further includes selecting, based on a mode control signal, either the first power supply signal or a second power supply signal, wherein a voltage level of the second power supply signal is greater than a voltage level of the first power supply signal (block 1403). It is noted that in some computer systems, the first and second power supply signals may be generated using a voltage regulator circuit, or the first and second power supply signals may be received from one or more power supply circuits external to the computer system.

In various embodiments, multiple operations may be performed using the mode control signal. For example, the method may include generating an inverted mode control signal using the mode control signal and the second power supply signal. As used herein, an inverted mode control signal has an opposite logical sense of the received mode control signal. In some cases, an inverting amplifier (e.g., inverter 1305) may be used to generate the inverted mode control signal.

The method may also include generating a buffered mode control signal using the inverted mode control signal and the first power supply signal. As used herein the buffered mode control signal has a same logical sense as that of the received mode control signal. An inverting amplifier, such as, inverter 1308, may be used to change the logical sense of the inverted mode control signal to generate the buffered mode control signal.

The inverted mode control signal and the buffered mode control signal may be used in some embodiments in the generated of a switch control signal that is coupled to a control terminal of a switch device included in the power switch circuit. For example, the method includes selectively coupling a switch control signal to a selected one of the first and second power supply signals based on the inverted mode control signal and the buffered mode control signal. In various embodiments, a complex logic gate, such as, inverter 1317, may be used to perform the operations described above.

The method also includes selectively deactivating the switch device based on the input control signal and using a selected one of the first and second power supply signals (block 1404). In some embodiments, selectively deactivating the switch device includes coupling a switch control signal, that is coupled to a control terminal of the switch device, to the second power supply signal. Alternatively, in other embodiments, selectively deactivating the switch device includes coupling the switch control signal to the first power supply signal.

In some cases, the method further includes generating an output control signal based on the input control signal, wherein the output control signal is coupled to another power switch circuit. With each power switch circuit buffering its associated input control signal to generate an output control signal that is to be used by another power switch circuit, numerous power switch circuits may be employed without having to individually wire each power switch circuit to a common control signal which may result in a large capacitive load as well as the use of numerous wiring resources. The method concludes in block 1405.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a switch device configured to selectively couple a power terminal of a circuit block to a first power supply signal based on a switch control signal; and
a control circuit including a first inverter, wherein the control circuit is configured to
receive a mode control signal and an input control signal;
wherein the first inverter is configured to generate an inverted mode control signal using the mode control signal; and
wherein the control circuit is further configured to:
select one of the first power supply signal and a second power supply signal based on the mode control signal, wherein a voltage level of the second power supply signal is greater than a voltage level of the first power supply signal; and
generate the switch control signal, by coupling the switch control signal to a selected one of either the first power supply signal or the second power supply signal, wherein a selection of either the first power supply signal or the second power supply signal is performed using the input control signal and the inverter mode control signal.

2. The apparatus of claim 1, wherein to select one of the first power supply signal and the second power supply signal, the control circuit is further configured to:
select the first power supply signal in response to a determination that a value of the mode control signal is indicative of a first operation mode of the switch device; and
select the second power supply signal in response to a determination that the value of the mode control signal is indicative of a second operation mode of the switch device, wherein a leakage current of the switch device is less while operating in the second operation mode than while operating in the first operation mode.

3. The apparatus of claim 1, wherein the control circuit further includes a second inverter configured to generate a buffered mode control signal using the inverted mode control signal and the first power supply signal.

4. The apparatus of claim 1, wherein the control circuit is further configured to generate an output control signal based on the input control signal, wherein the output control signal is coupled to another control circuit.

5. A method, comprising:
receiving an input control signal by a power switch circuit that includes a switch device coupled between a power terminal of a circuit block and a first power supply signal;
selecting, based on a mode control signal, either the first power supply signal or a second power supply signal, wherein a voltage level of the second power supply signal is greater than a voltage level of the first power supply signal; and
selectively deactivating the switch device by coupling a switch control signal, that is coupled to a control terminal of the switch device, to the second power supply signal, wherein the coupled is performed using the input control signal and using a selected one of the first and second power supply signals.

6. The method of claim 5, further comprising generating an output control signal based on the input control signal, wherein the output control signal is coupled to another power switch circuit.

7. The method of claim 5, wherein selectively deactivating the switch device includes coupling a switch control signal to the first power supply signal, wherein the switch control signal is coupled to a control terminal of the switch device.

8. The method of claim 5, further comprising, generating an inverted mode control signal using the mode control signal and the second power supply signal.

9. The method of claim 8, further comprising generating a buffered mode control signal using the inverted mode control signal and the first power supply signal.

10. The method of claim 9, further comprising selectively coupling a switch control signal to a selected one of the first and second power supply signals based on the inverted mode control signal and the buffered mode control signal, wherein the switch control signal is coupled to a control terminal of the switch device.

11. A system, comprising:
a plurality of circuit blocks;
a power management unit configured to generate a plurality of internal power supply signals using an external power supply signal;
a first power switch circuit coupled between a power terminal of a particular one of the plurality of circuit blocks and a first internal power supply signal of the internal power supply signals, wherein the first power switch circuit is configured to:
receive a mode control signal and an input control signal;
select one of the first internal power supply signal and a second internal power supply signal of the plurality of internal power supply signals based on the mode control signal, wherein a voltage level of the second internal power supply signal is greater than a voltage level of the first internal power supply signal;

generate a switch control signal using the input control signal and a selected internal power supply signal; and selectively couple the power terminal to the first internal power supply signal based on the switch control signal.

12. The system of claim 11, wherein to select one of the first internal power supply signal and the second internal power supply signal, the first power switch circuit is further configured to:

select the first internal power supply signal in response to a determination that a value of the mode control signal is indicative of a first operation mode of the first power switch circuit; and select the second internal power supply signal in response to a determination that the value of the mode control signal is indicative of a second operation mode of the first power switch circuit, wherein a leakage current of the first power switch circuit is less while operating in the second operation mode than while operating in the first operation mode.

13. The system of claim 11, wherein the first power switch circuit includes a first inverter configured to generate an inverted mode control signal using mode control signal and the second internal power supply signal.

14. The system of claim 13, wherein the first power switch circuit further includes a second inverter configured to generate a buffered mode control signal using the inverted mode control signal and the first internal power supply signal.

15. The system of claim 14, wherein the first power switch circuit further includes a selection circuit configured to selectively couple the switch control signal to either the first internal power supply signal or the second internal power supply signal using the inverted mode control signal and the buffered mode control signal.

16. The system of claim 11, wherein the first power switch circuit is further configured to generate an output control signal based on the input control signal, wherein the output control signal is coupled to a second power switch circuit.

17. The system of claim 11, wherein to selectively couple the power terminal to the first internal power supply signal, the first power switch circuit is further configured to couple the switch control signal to a ground supply signal in response to a determination that a value of the input control signal at ground potential.

18. The apparatus of claim 1, further comprising a sensor circuit configured to generate the mode control signal using at least one measured parameter.

19. The apparatus of claim 18, wherein the at least one measured parameter includes a rate of change of a voltage level of the switch control signal.

20. The method of claim 5, further comprising, generating the mode control signal using a rate of change of a voltage level of the switch control signal.

* * * * *